United States Patent
Ward

(10) Patent No.: US 7,246,331 B2
(45) Date of Patent: Jul. 17, 2007

(54) METHOD FOR OPTIMIZING INTEGRATED CIRCUIT DEVICE DESIGN AND SERVICE

(75) Inventor: David Ward, Broomfield, CO (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 10/966,492

(22) Filed: Oct. 15, 2004

(65) Prior Publication Data

US 2006/0085782 A1    Apr. 20, 2006

(51) Int. Cl.
*G06F 17/50* (2006.01)

(52) U.S. Cl. .................................................. 716/4

(58) Field of Classification Search ............... None
See application file for complete search history.

(56) References Cited

U.S. PATENT DOCUMENTS

| | | | | |
|---|---|---|---|---|
| 6,484,134 | B1 * | 11/2002 | Hoskote | 703/14 |
| 6,643,827 | B1 * | 11/2003 | Yang | 716/2 |
| 7,058,910 | B2 * | 6/2006 | Bharadwaj et al. | 716/5 |

* cited by examiner

*Primary Examiner*—Leigh M. Garbowski
(74) *Attorney, Agent, or Firm*—Duft, Bornsen & Fishman, LLP

(57) ABSTRACT

Improved analysis and refinement of integrated circuit device design and other programs is facilitated by methods in which an original program is partitioned into subprograms representing valid computational paths; each subprogram is refined when cyclic dependencies are found to exist between the variables; computational paths whose over-approximated reachable states are found to be contained in another computational path are merged; and finally, the remaining subprograms conjoined decision conditions become candidates for hints for program refinement.

21 Claims, 7 Drawing Sheets

US 7,246,331 B2

METHOD FOR OPTIMIZING INTEGRATED CIRCUIT DEVICE DESIGN AND SERVICE

FIELD AND BACKGROUND OF INVENTION

This invention relates to integrated circuit design techniques.

The design of integrated circuit devices conventionally uses hardware description languages (HDLs) to describe circuits (herein also sometimes called "systems") at various levels of abstraction. As a circuit design evolves, designers and verification engineers (whose job it is to assure that the design functions appropriately) conduct analysis of the device being designed to evaluate the quality of the design and to hopefully find and eliminate any inadequacies potentially leading to future problems such as impossibility or inaccuracy in performance of the device.

One problem encountered in such analysis is referred to as a "state explosion", which occurs when an input to the design, intended to permit analysis of the response of the device to a particular input, generates such a large number of possible output or intermediate states as to overrun any memory used in supporting the analysis.

Reachability analysis plays a central role in formal verification of sequential circuits. One of the state-of-the-art approaches for reachability analysis and formal verification of circuits modeled as Finite State Machines (FSMs) exploits symbolic computations based on Binary Decision Diagrams (BDDs). However, the known state explosion problem may cause large intermediate BDD sizes during the exploration of the state space of a system. The conventional breadth-first search (BFS) strategy, used in most implicit model checking algorithms, is the main culprit. Others have approached this problem by devising techniques that simplify the system model employed during BFS.

Some recent work in avoiding the state explosion problem during one known analysis procedure, breadth-first symbolic traversal based on Binary Decision Diagrams (BDDs), applies hints to constrain the transition relation of the system to be verified. Hints are expressed as constraints on the primary inputs and states of a circuit modeled as a Finite State Machine (FSM) and can often be found with the help of simple heuristics by someone who understands the circuit well enough to devise simulation stimuli or verification properties for it. However, the ease of finding good hints is limited by the size and complexity of the design, and extending their applicability to larger designs is a key issue.

In one such proposal, "hints" are used to guide the exploration of the state space. In that proposal, hints are classified into those that depend on the invariants being checked (proving properties that should hold in all reachable states of a system) and those that capture knowledge of the design. Hints are applied by constraining the transition relation of the system; the constrained traversal of the state space proceeds much faster than the unconstrained system (original transition relation). This method obtained orders-of-magnitude reductions in time and space requirements during the exploration of the state space. Hints can often be found by someone who understands the design well enough to devise simulation stimuli or verification properties for it. However, in large complex designs, identifying good hints can be a labor-intensive process requiring many attempts, and in most cases does not avoid the state space explosion problem. Acceptance of this method by designers and verification engineers will certainly benefit from a more efficient technique to devise good hints from a system being verified.

SUMMARY OF THE INVENTION

Having in mind the field and problems identified above, one purpose of this invention is to facilitate improved analysis of integrated circuit device design. In realizing this purpose of this invention, the state explosion problem is preempted by constructing systems small enough to make automatic checking tractable, yet large enough to capture the information relevant to the property being checked—reachability in this case. The method here disclosed exploits these observations and can be summarized as follows: first, the original program is partitioned into subprograms representing valid computational paths; second, each subprogram is refined when cyclic dependencies are found to exist between the variables; third, computational paths whose over-approximated reachable states are found to be contained in another computational path are merged; and finally, the remaining subprograms conjoined decision conditions become candidates for hints.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention. In particular, while the context for this disclosure is the design of integrated circuit devices, it is known that the "state explosion" problem here addressed is also found in software design and believed that the techniques and method here described will find usefulness in such applicatins.

Figure 1:
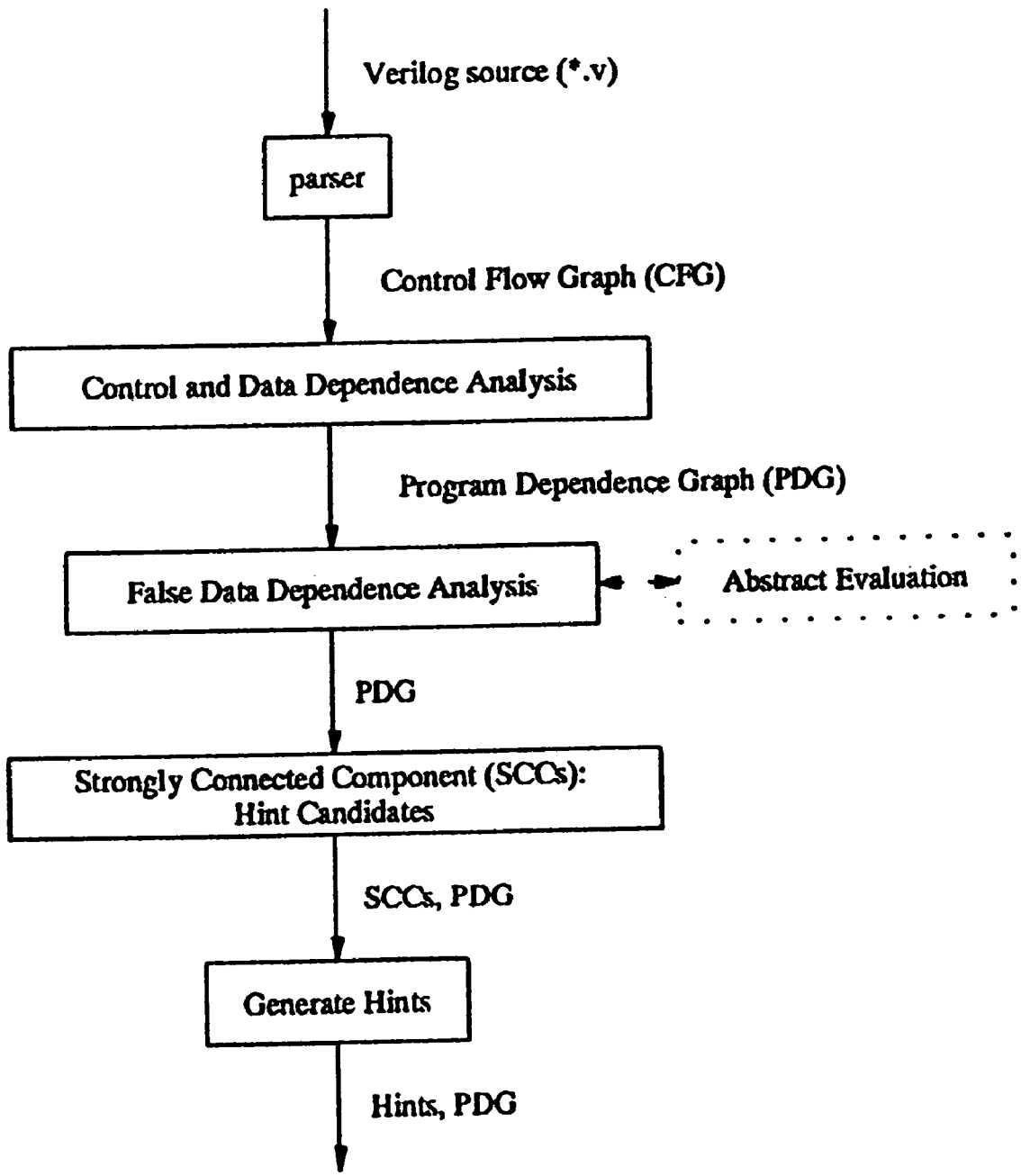
FIG. 1 is a schematic illustration of the steps of a method in accordance with this invention.

The program analysis techniques employed to accomplish the objective outlined above are program parsing or slicing to abstract subprograms from the original program text, and abstract interpretation to obtain the over-approximate reachable states and relevant properties for each subprogram. Additionally, the program dependence graph (PDG) is the intermediate form of choice for its rich set of supporting algorithms and efficient representation of control and data dependencies of program operations. The steps of such a method are illustrated in FIG. 1.

Analysis done on programs using this technique is achieved at a higher level of abstraction (program text) thus circumventing the time-space complexity issues that plague BDD-based formal verification methods. This has been validated using a subset of Verilog (behavioral Verilog), however, it is not restricted to this class of languages. It can be easily extended to any simple imperative language.

Hardware description languages (HDLs) like Verilog and VHDL, are used by hardware developers to describe circuits at various levels of abstraction (e.g., RTL, behavioral). HDL programs are translated into Finite State Machines (FSMs) to do reachability analysis. While the technique here described has been validated using behavioral Verilog, it will here be explained using the much simpler imperative While language of Nielson et al, *Principles of Program Analysis*, Springer-Verlag, Berlin, 1999. The syntax of the While language is represented below. A single entry and exit element are assumed for each well-formed program.

$AEXP ::= n|var|a1+a2|a1-a2$ $BEXP ::= true|false|a1=a2|a1<a2|a1 \leq a2|a1>a2|a1$
$\geq a2|-b|b1 \wedge b2$ $S ::= var := a|S_1; S_2|read\ x$ if b then $S_1$ else $S_2$|b do S|skip What is here used is a structural operational semantics for While as defined in the Neilson citation above. The meaning of a program P is defined as the final state, where state σ is a mapping from variables to values (integers), that can be reached after a number of transitions. Each transition has the form (S, σ)→ρ where ρ is either an intermediate state (S', σ') or the final state σ'. The rules for the transition are as follows:
 1. The var:=a rule updates the state with the value of the right-hand side.
 2. The if . . . rule selects the true or false alternative, depending on the value of the condition without changing the value of state ($S_1$, σ) if true, or ($S_2$, σ) otherwise.
 3. The while . . . rule repeats the statement S until the condition b is false, when it terminates with a skip statement ((if b then (S; while b do S) else skip, σ))
 4. The $S_1;S_2$ sequence rules: one, when the first statement $S_1$ in a sequence goes to an intermediate statement and state ($S_1';S_2$, σ' (which is the case for the if . . . , while . . . , $S_1;S_2$); two, when the first statement terminates immediately ($S_2$, σ') (which is the case for the var:=a and skip).
 5. The skip rule does nothing—no change to state.

Given a set of hints $\tau_1, \tau_2, \ldots \tau_k$ (where each τ is a transition relation obtained by constraining the inputs or state variables of the model) the computation of the reachable states can be decomposed into the computation of a sequence of fix points—one for each hint. If hints are chosen properly, the computation of least fix points can be substantially sped up. If small transition systems result for each τ, reachability analysis may proceed further compared to computing the model fix point directly, and in some cases go to completion by avoiding the memory explosion problem. Intuitively, it is easy to reason about the benefits afforded to invariant checking from these results.

The present invention proposes that, given a sequence of monotonic functionals $\tau_1, \tau_2, \ldots \tau_k$ such that $\tau_1 \leq \tau_k$ for 0<i<k, the sequence $\rho_1, \rho_2, \ldots, \rho_k$ of least fix points defined by $\rho_0 = 0$ $\rho_i = \mu X.\rho_{i-1}\ V\tau_i(X),\ 0 < i \leq k$ monotonically converges to $\rho = \mu X.\tau_k(X)$; that is, $\rho_0 \leq \rho_1 \leq \ldots \leq \rho_k = \rho$ The traditional BFS reachability analysis algorithm can be modified to take advantage of hints: first, each hint, in order, is used to constrain the original transition relation, the algorithm is allowed to run normally until all reachable states are reached. The frontier set for each run is either the initial states, for the first hint, or the reached states from the previous run; finally, the original transition relation is restored and runs to completion or is terminated early due to time-space exhaustion. Its frontier set is the set of reachable states produced by the last hint.

Many program analysis techniques work on graphs derived from the program text. Among these, the Control Flow Graph (CFG) is a directed graph that represents the flow of control of a program. Each node represents an assignment or branching statement $S_i$ in a program P. Each directed arc represents flow of control from one node to another. A CFG can be extracted in a single pass traversal over a program. A CFG would be constructed for each Verilog "always" block or each "procedure" in a imperative language. The CFG is the primary data structure and there exist a plethora of efficient algorithms to do graph-based operations (e.g., searches). Preparation of a CFG as a step in the methods of this invention is indicated in FIG. 1.

A control flow graph CFG of a program P with statements S is a directed graph G=(V, E), where:
 V=S ∪ {exit,entry,junction} is a finite set of nodes, where {entry, exit, junction} are distinguished entry, exit, and junction nodes, respectively, and
 E⊂V×V is a control flow relation, whose elements are directed edges.

Intuitively, edges are constructed in the normal way from statement $S_1$ to $S_2$ by tracing the sequential execution flow of a program. Generally, edges E represent the transfer of control between statements S.

A path p in a CFG is a sequence of nodes $v_1, v_2, \ldots V_n$ such that $n \geq 0$ and $(v_i, v_{i+1}) \in E$ for $i=1, 2, \ldots, n-1$.

Control dependence represents the effect of conditional branch statements on the behavior of programs. Given any two statements $S_1$ and $S_2$ in P, statement $S_2$ is control-dependent on $S_1$ if $S_1$ is a conditional branch statement and the control structure of P potentially allows $S_1$ to decide whether $S_2$ will be executed. Control dependence can be defined strictly in terms of a CFG.

$S_1$ is postdominated by $S_2$ in a CFG if all paths from $S_1$ to exit include $S_2$.

$S_2$ is control dependent on $S_1$ if and only if:
 1. There exists a path p from $S_1$ to $S_2$ and the path is non-null, such that $S_2$ postdominates every node along the path, and
 2. $S_1$ is not postdominated by $S_2$.

If $S_2$ is control dependent on $S_1$ in a CFG, then $S_1$ must have two outgoing edges. Following one of the edges always leads to $S_2$, and using the other edge there is a path to exit that bypasses $S_2$. A control dependent edge can be added to the CFG to show the dependence relation. The resulting CFG augmented with the control dependence information is referred to as $G_{cd}=(V,E \cup E_{cd})$, where $E_{cd}$ is the set of control dependence edges. Control dependence is an important concept for it is needed to explain the meaning of a static program slice. A control and data dependence analysis is indicated in FIG. 1 between the generation of a CFG and the generation of a PDG.

Attention now turns to a discussion of different types of dependence between statements S in a CFG. Given any two statements $S_1$ and $S_2$, one or more of the following data dependence relations may hold between them:
 data dependence representing an assignment of a variable followed by a read access (use) of the same variable (without any intervening assignment of the same variable);

output dependence representing an assignment to a variable by another assignment to the same variable; and antidependence representing a read access (use) of a variable followed by an assignment of the same variable. Only data dependences between statements are considered in this discussion. OUT($S_i$) may be the left-hand side variable of $S_i$ and IN($S_i$) may be the set of right-hand side variables of $S_i$, such that for any two statements $S_1$ and $S_2$ in a CFG, the data dependence is defined as follows:

$S_2$ is data dependent on $S_1$ if and only if:

1. $\exists x \in IN(S_2).x=OUT(S_1)$; and
2. the value x in $S_1$ is used to compute the value of the left-hand side of $S_2$.

The resulting CFG augmented with the data dependence information is referred to as $G_{dd}=(V, E \cup E_{dd})$. Data dependence information is used to identify strongly connected components (SCCs) that may exist for a trace of the execution flow of a program.

A Program Dependence Graph (PDG) derived from the program text is a lossless transformation of the original program. It is possible to go back and forth from one to the other. The PDG is used as an intermediate representation. The PDG, which represents significant information regarding the control and data dependencies of a program, can be defined in terms of the CFG; PDG=(V, E $\cup$ $E_{cd} \cup E_{dd}$.

A goal of this invention is to statically (and cheaply) determine pertinent information of a program that would otherwise be ascertained during run-time. More specifically, it is desired to calculate the run-time behavior of a program without having to run it on all input data, and while guaranteeing termination of the analysis. Abstract interpretation provides the necessary framework in which the operational semantics of a program is defined by a transition relation η over a set of program states σ. This framework aims at computing safe approximations of fixed points of continuous functions over complete lattices. From the usual CFG operational semantics, a collecting semantics is derived automatically by attaching to each program point or CFG edge a set of contexts (states) that flow to that point during execution. The collecting semantics summarizes real run-time behavior, whereas abstract semantics is to compute properties for the program points that describe the concrete context sets. The abstract semantics does so by executing the CFG with abstract values that represent context properties.

Cousot and Cousot, in an article published in *Proceedings of the ACM Symposium on the Principles of Programming Languages*, 1977, introduced a standard lattice of integer intervals as an abstract domain for data-flow analysis of programs with variables assuming integer values.

Abstract domain/of integer intervals may be defined as:

$I=\{[a, b] | a, b \in Z, a \leq b\} \cup \{[a, +\infty) | a \in Z\} \cup \{(-\infty, b] | b \in Z\} \cup \{(-\infty, +\infty)\} \cup \{\bot\}$ where the ordering $\leq$ is the natural ordering on the integers.

The ordering relation $\leq_I$ on I is defined by the following rules:

1. for any $x \in I$, $\bot \leq_I x \leq_I (-\infty, +\infty)$, $\Leftrightarrow$
2. for any $a, b, c, d \in Z$, $[a, b] \leq_I [c, d] \Leftrightarrow c \leq a, \wedge b \leq d$,
3. for any $b, d \in Z$, $(-\infty, b] \leq_I (-\infty, d] \Leftrightarrow b$,
4. for any $a, b, d \in Z$, $[a, b] \leq_I (-\infty, d] \Leftrightarrow b \leq d$,
5. for any $a, c \in Z$, $[a, +\infty) \leq_I [c, +\infty) \Leftrightarrow c \leq a$,
6. for any $a, b, c \in Z$, $[a, b] \leq_I [c, +\infty) \Leftrightarrow c \leq a$.

(I, $\leq_I$) is a complete lattice that enjoys a Galois insertion with (P (Z), $\subseteq$), which is determined by the following mapping:

$$\alpha_I(X) = \begin{cases} [a, b] & \text{if } \min(X) = a \text{ and } \max(X) = b \\ (-\infty, b] & \text{if } \not\exists \min(X) \text{ and } \max(X) = b \\ [a, +\infty) & \text{if } \min(X) = a \text{ and } \not\exists \max(X) \\ (-\infty, +\infty) & \text{if } \not\exists \min(X) \text{ and } \not\exists \max(X) \end{cases}$$

$$\gamma_I(X) = \begin{cases} \{z \in Z | a \leq z \leq b\} & \text{if } x = [a, b] \\ \{z \in Z | z \leq b\} & \text{if } x = (-\infty, b] \\ \{z \in Z | a \leq z\} & \text{if } x = [a, +\infty) \\ Z & \text{if } x = (-\infty, +\infty) \end{cases}$$

$$\beta_I(X) = \begin{cases} \bot \beta_I x = x \\ x\beta_I \bot = x \\ [a_1, b_1]\beta_I[a_2, b_2] = [\text{if } a_2 < a_1 \text{ then } -\infty \text{ else } a_1, \\ \text{if } b_2 > b_1 \text{ then } +\infty \text{ else } b_1] \end{cases}$$

If Z and I are posets, and $\gamma_I$ and $\alpha_I$ are monotonic functions such that $\forall z \in Z.z \leq \gamma_I(\alpha_I(z))$ and $\forall i \in I.\alpha_I\gamma_I(i))=i$, then the quadruple $(\gamma_I, I, Z, \alpha_I)$ is a Galois insertion.

The fix point computations for the interval lattice I may in theory require an infinite number of iterations. A speedup technique has been proposed that uses the widening operator $\beta_I$ to transform infinite iterative computations to finite but approximated ones.

The hints generated to help symbolic traversal of a model graph should select subsets of transitions that allow reachability analysis to visit sets of states with many elements and compact representations. Since these representations are usually Binary Decision Diagrams (BDD), it may be said simply that an objective is to have many states with small BDDs. When a model has several major modes of operation, for instance it can execute a set of instructions, enabling one mode at the time is often effective in keeping the BDD sizes under control. The approach of this invention to producing hints automatically is based on identifying the different modes of operation from the Control Flow Graph (CFG) of the model, and prioritizing them according to their dependencies and their promise to reduce time and memory requirements. The process can be divided in three major phases (see FIG. 1):

From the program text a CFG is extracted and from it a reduced program dependency graph (PDG);

From the CFG a list of candidate subprograms is compiled; and

Using the PDG, candidates are sorted according to their dependencies and usefulness. Hints are generated from the best candidates.

These three phases will now be described in more detail.

The program that defines the model to be analyzed is translated into a CFG, which is augmented with data dependency information to produce a PDG. Since the analysis is conservative, some data dependency arcs in the PDG are false, that is, do not correspond to real data dependencies in the program. Since more data dependency arcs result in fewer degrees of freedom for the prioritization of modes of operation, it is desirable to remove as many false arcs as possible, without incurring excessive costs in the process. Each data dependency arc is tested in turn to determine whether the definition at the tail of the arc can actually reach the usage at its head by augmenting the program with token variables that are set to specific values when assignments to the variables of interest occur. The program slice corresponding to the token variable of the usage variable is extracted from the PDG. The check whether the definition can reach the usage is thus translated into the check for an invariant on the token variable of the usage variable.

Specifically, suppose that the dependency of use $S_1:x:=v_1$ from definition $S_2:y:=x$ is investigated. Two token variables $t_1$ and $t_2$ are added to the program by making the following changes.

Assignments $t_1:=0$ and $t_2:=0$ are added to the beginning of the program.

$S_1$ is changed to $x:=v_1$; $t_1:=1$.

Every other assignment to $x:=v$ is changed to $x:=v$; $t_1:=0$.

$S_2$ is changed to $y:=x$; $t_1:=t_2$.

If in the program slice for $t_2$ no state is reachable in which $t_2=1$, then the data dependency arc from $S_1$ to $S_2$ is removed. Note that we are only interested in direct dependencies. For instance, consider $S_1:x:=2$, $S_2:y:=x$, and $S_3:x:=x+1$. If $S_3$ is always executed between $S_1$ and $S_2$, the dependency arc between $S_2$ and $S_1$ is removed. However, the dependencies of $S_3$ on $S_1$, and of $S_2$ on $S_3$ imply, by transitivity, the one of $S_2$ on $S_1$.

Though program parsing or slicing may greatly reduce the cost of checking the $t_2=0$ invariant relative to reachability analysis of the full model, this is not always the case; hence, each model checking run is allotted a short time to complete. If it does not finish, a less accurate, but less expensive test is applied. The augmented program slice is analyzed with abstract interpretation. If also abstract interpretation fails to complete within the allotted time, the arc is (conservatively) retained.

Figure 2:
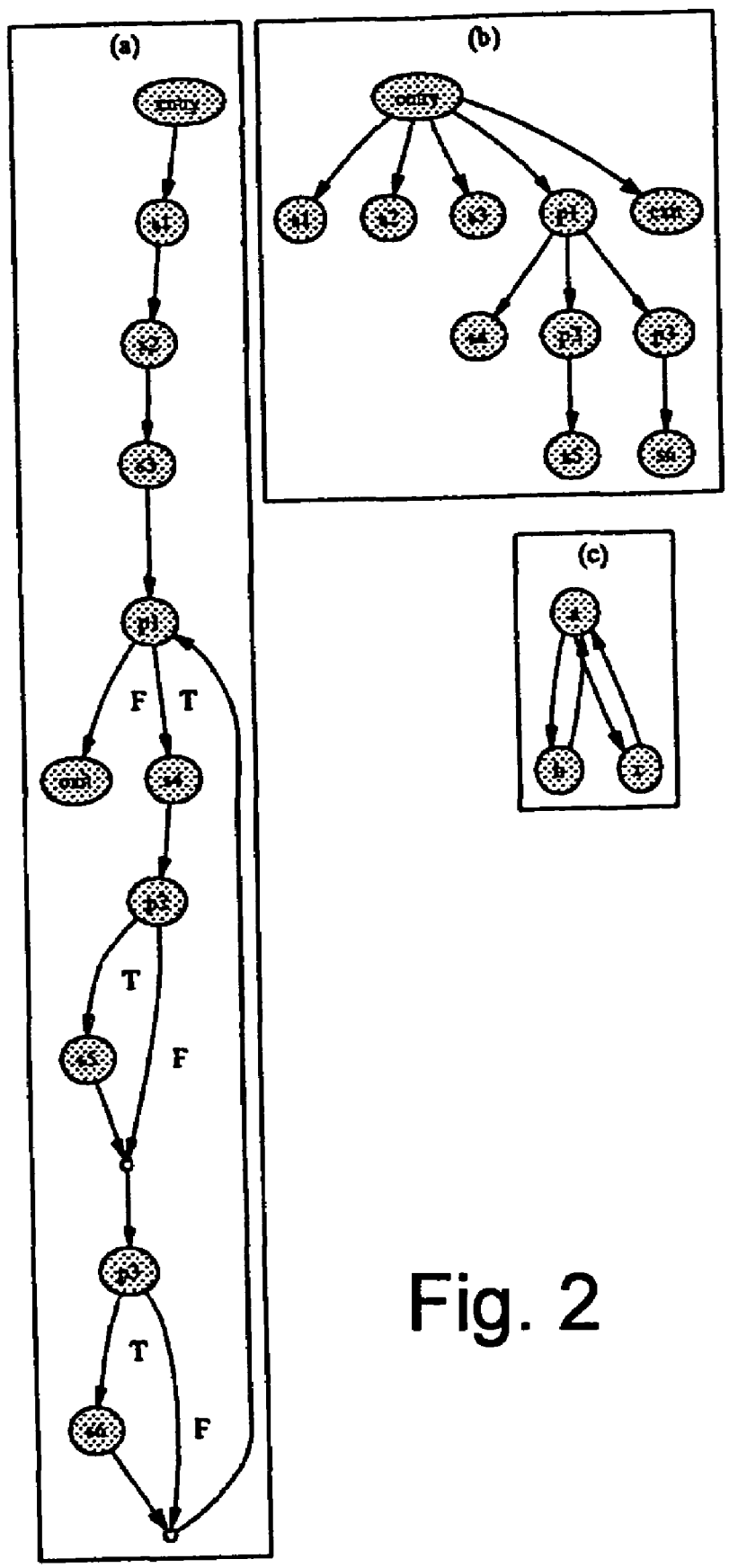
FIG. 2 is an illustrative representation of BDDs.
Figure 3:
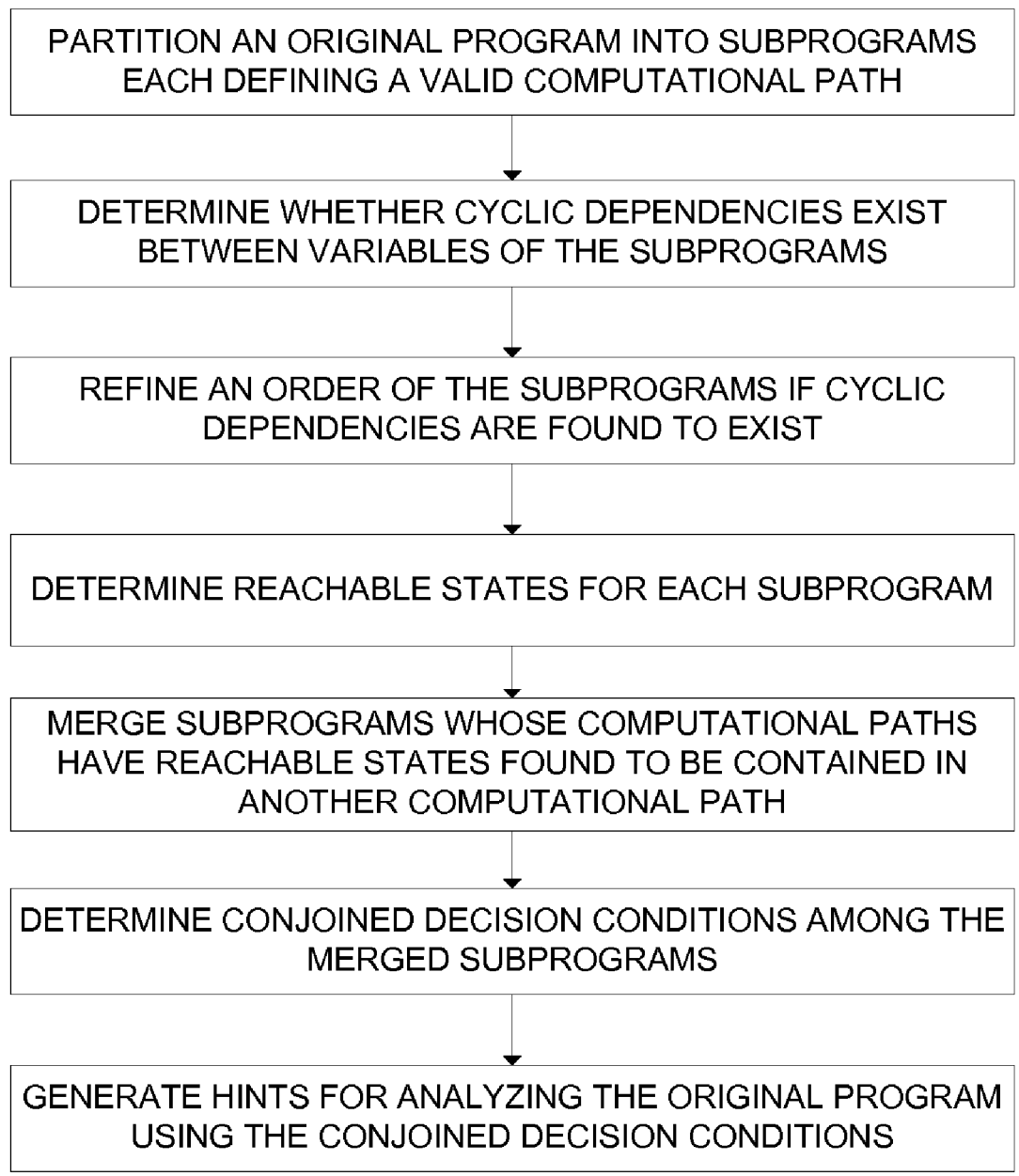
FIGS. 3–7 are flowcharts illustrating the steps of methods in exemplary embodiments of the invention.
Figure 4:
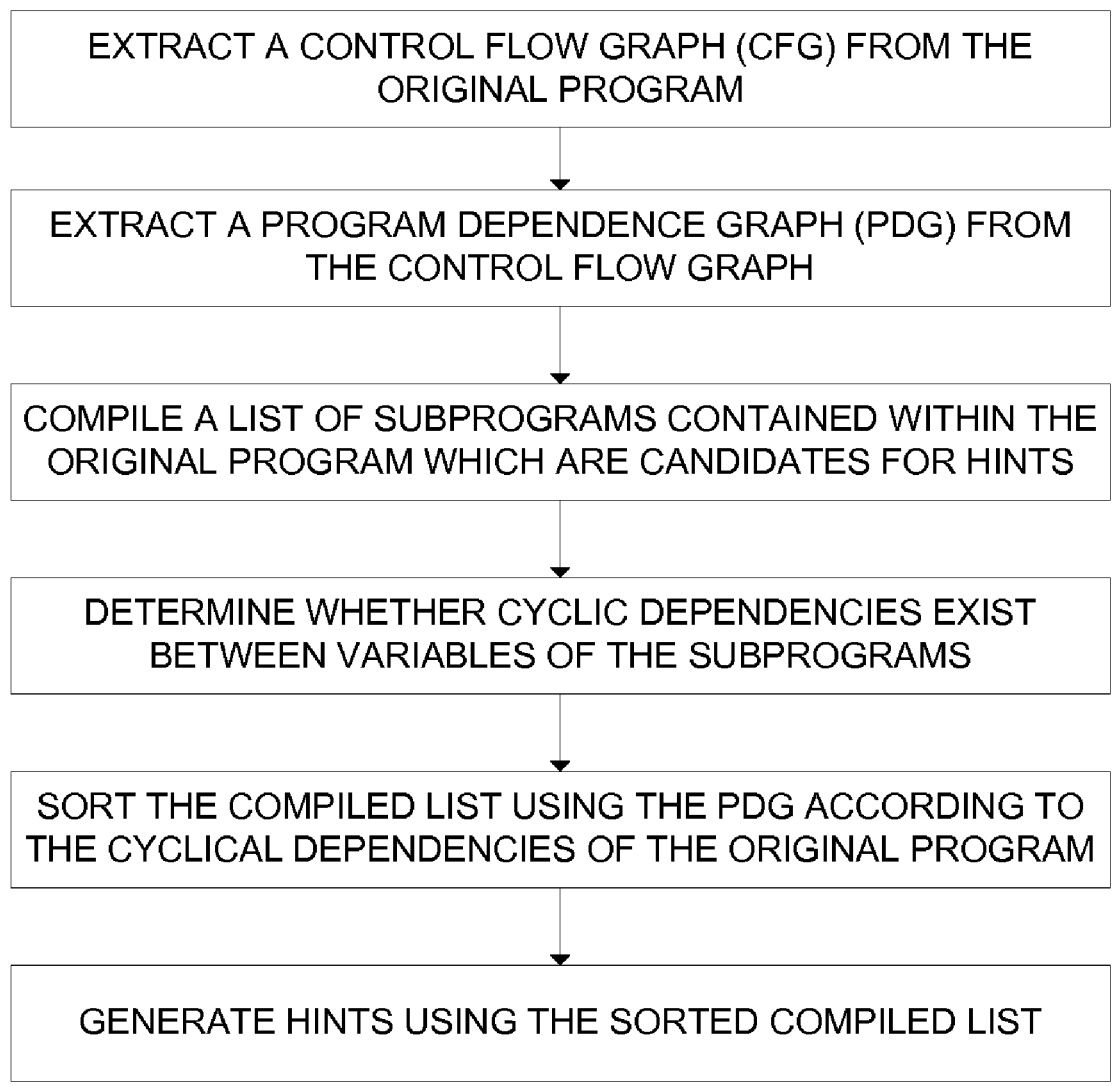
Figure 5:
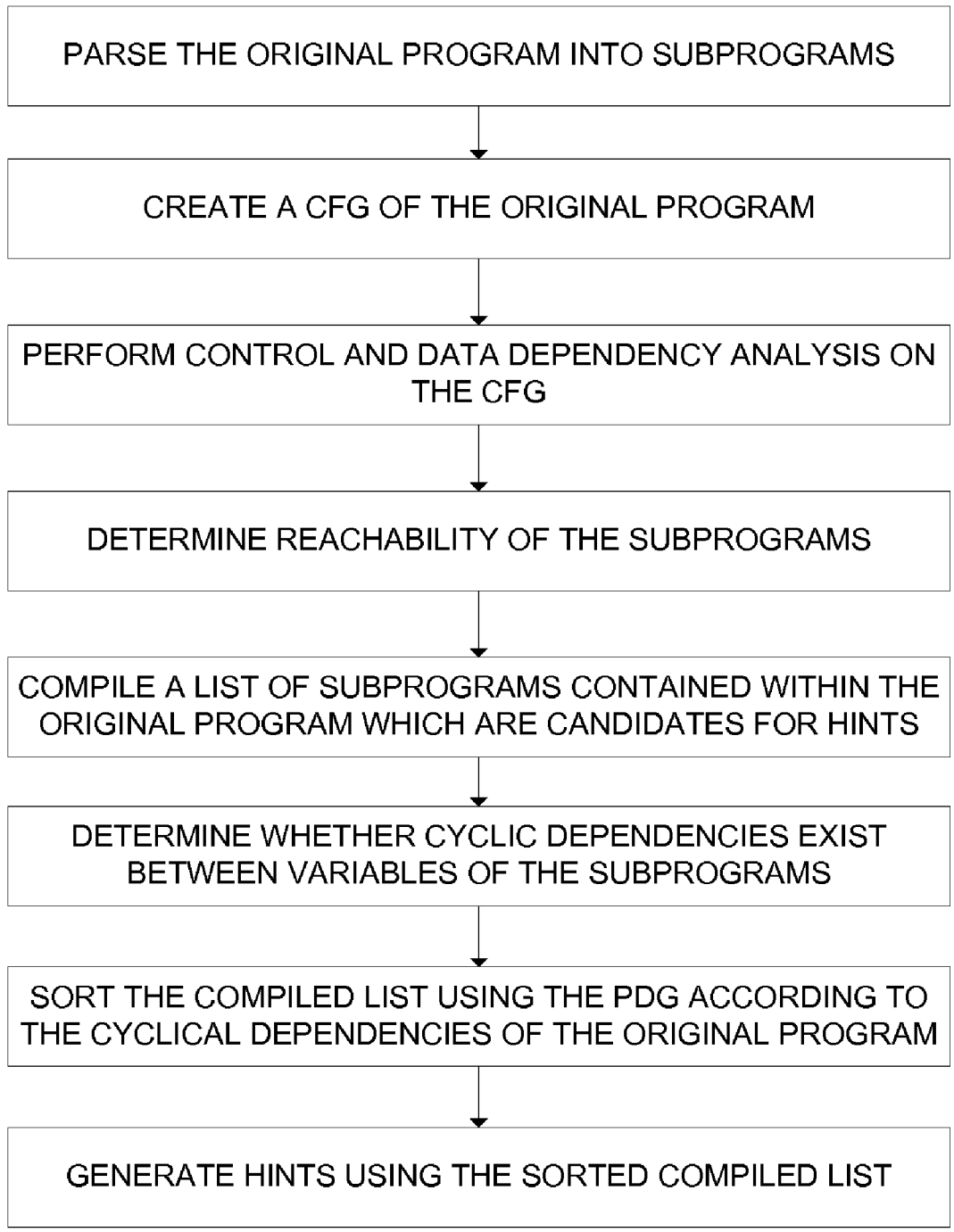
Figure 6:
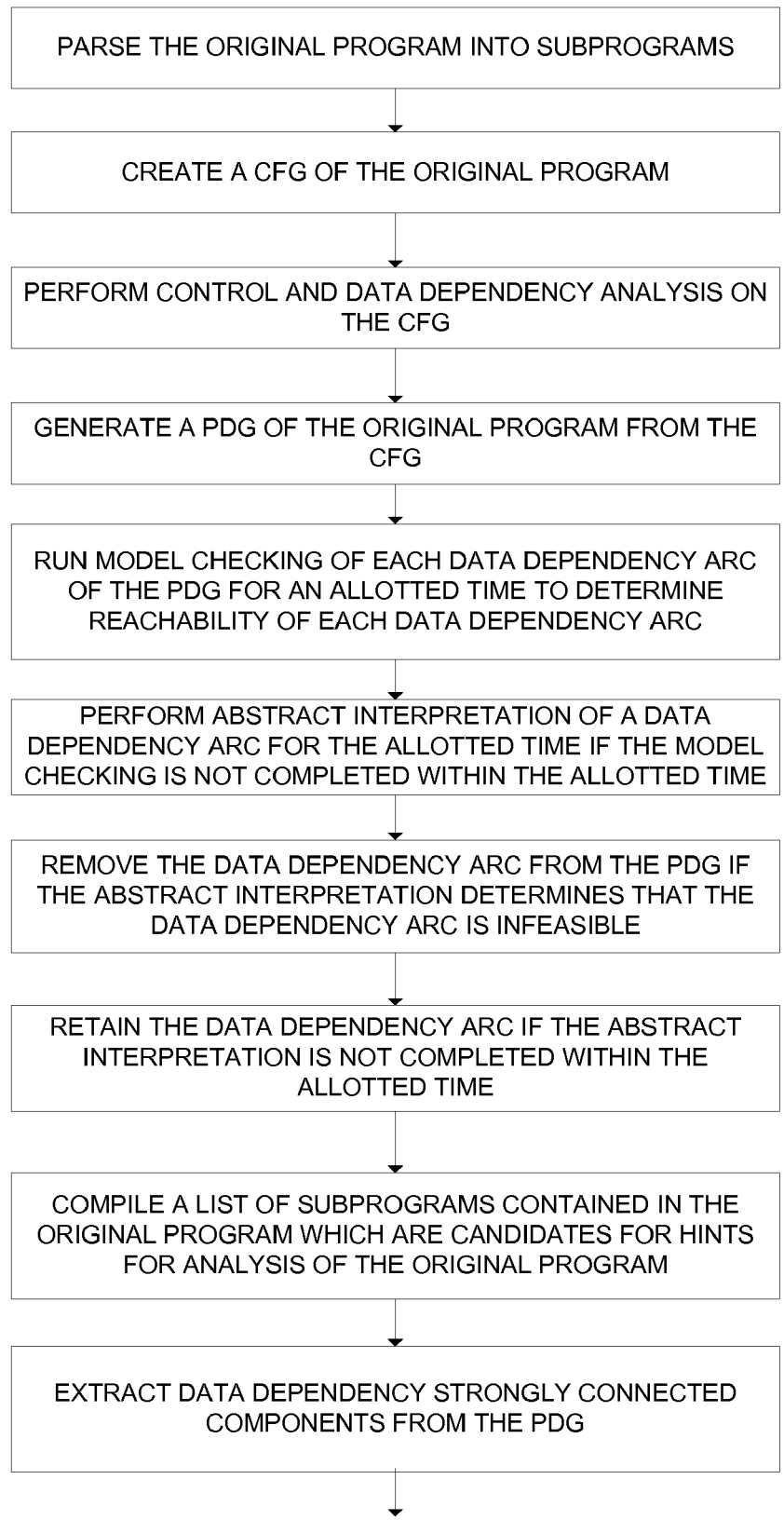
Figure 7:
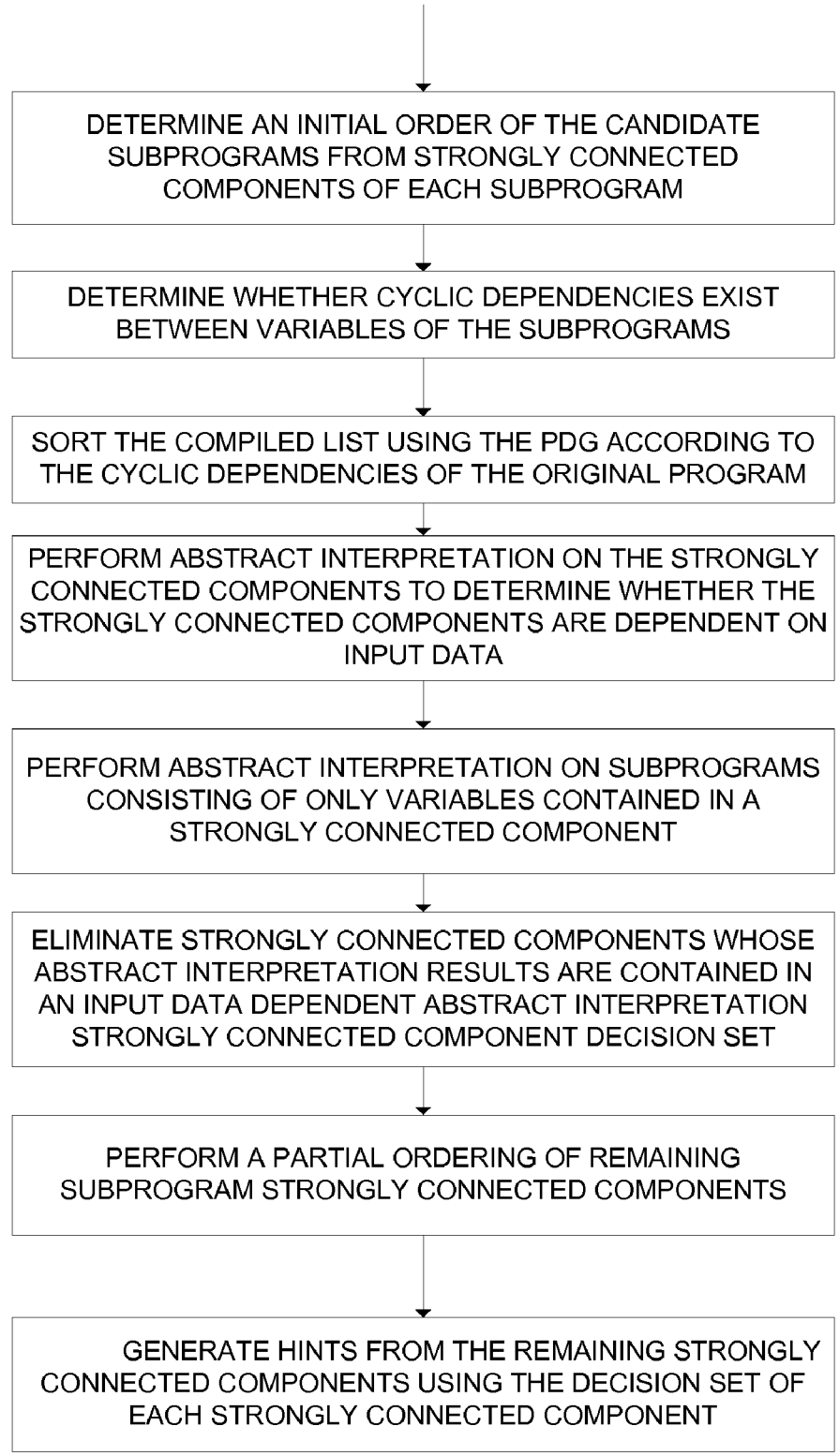

The modified PDG with (some) false data dependencies removed is one of the two inputs to the final step of our procedure that outputs a list of hints. The other input is a list of subgraphs of the CFG, each corresponding to a mode of operation. The subgraphs are identified by a procedure based on the enumeration of the spanning trees of a graph such as that of FIG. 2. The graph obtained from the CFG by removing the back arcs is a polar graph. Since the graph is polar, there is exactly one path in each spanning tree connecting the poles of the graph. All other paths correspond to dead ends. This path is augmented with all the back arcs that connect its nodes to produce a candidate subgraph.

The enumeration of the spanning trees is augmented so as to take into account input dependencies and feasibility of paths. When a candidate subgraph is generated, the path enabling conditions are tested for joint satisfiability.

The CFG of a reasonably complex model may have many feasible spanning trees. Producing one hint from each of them would lead to too many hints, many of which would not contribute enough states to pay for themselves. Therefore, the set of candidates produced by the enumeration procedure is pared down. The selection of the best candidates is heuristic. Two criteria are currently suggested. The first favors those subgraphs with more states reached during abstract interpretation of the corresponding subprograms. The second criterion favors those subgraphs that result in smaller BDDs for the transition relations for the corresponding models. Ideally, a criterion is desired that accounts for both the number of states and the BDD sizes. However, it is difficult to estimate accurately both without going all the way to guided search. The pruning process eliminates all candidates that prove inferior according to at least one heuristic.

The final step of the procedure sorts the list of candidates using the information on data dependencies provided by the PDG. One hint is then produced from each candidate subgraph by extracting its path enabling predicate. The path enabling predicate of a path is the conjunction of the predicates of all choice nodes along the path. The order in which hints are applied may greatly influence their effectiveness. This is particularly the case when there are data dependencies between the variables occurring in different subprograms. Suppose subprograms $P_1$ and $P_2$ are such that variable x is assigned in $P_1$ by an input statement, while in $P_2$ it is assigned a constant value v. Suppose also that x is used in an assignment $y:=x$ in $P_2$, and that that is the only assignment to y. Then, if the hint extracted from $P_2$ is applied before the hint derived from $P_1$, all the states reached after the two hints have been applied have $y=v$, whereas, if the order of application is reversed, there will be reachable states for each possible value of y.

In general, there will be cyclic dependencies among subprograms. Hence, the procedure is as follows. A Subprogram Dependency Graph (SDG) is formed with one node for each subprogram. Each node of the SDG is the set of nodes in the PDG that make up the corresponding subprogram. An arc connects nodes u and v of the SDG if there exists an arc (a,b) in the PDG such that a E u and b E v. The ordering of the candidate subprograms is obtained from the SDG. In particular the strongly connected components (SCCs) of the SDG define a preorder on the subprograms: We say that $u \prec v$ if there is a path from u to v in the SDG. The final order $\leq$ is always a refinement of this preorder in the following sense: if $u \prec v$ and v not$\prec$ u, then $u \leq v$. However, an arbitrary total order that refines the preorder may not work well, if there are just a few large SCCs.

The problem of deriving a total order from the preorder defined by the the SDG is decomposed into two subproblems. The first is the one of linearizing the partial order defined by the SCC quotient graph of the SDG. The second is to find total orders for the nodes of each SCC. The total order of the subprograms results from combining the solutions of these two subproblems in the obvious way.

Any topological sort of the nodes of the SCC quotient graph would satisfy the definition of order refinement. However, different orders result in BDDs of different sizes. It is normally advantageous to keep subprograms adjacent in the order if the operate on common variables. Therefore, to sort the SCCs of the SDG a depth-first search from the source nodes of the SCC quotient graph is performed.

The sorting of the nodes of an individual SCC is based on identifying a starting node, and then enumerating the elementary circuits of the SCC. As enumerate elementary circuits are enumerated from the designated start node, nodes are added to the total order as they appear in some elementary circuit. Reliance is placed on the fact that the enumeration algorithm outputs short circuits first. Short circuits are identified with with tight interaction, and therefore those nodes that have tighter interaction with the start node are put earlier in the order. The start node is selected based on the ease with which the variables in it can be controlled via primary inputs. To see why this factor plays an important role, consider, for instance, three an assignment $x:=y+z$, where y depends on other variables, whereas z is read from an external input. During reachability analysis, for any value of x, and any value of z there is value of z such that $x=y+z$. (Assuming signed integers.) Hence, the dependency on y, while present, is neutralized by the dependency on z.

This technique attempts to efficiently and effectively identify computational paths in a program that contribute most favorably to the speed-up of symbolic traversal while keeping the intermediate BDDs small. The fact that a program can be viewed as separate subprograms, updating each program variable, is used to advantage. Dividing a program into intermingling subprograms is similar to the partitioned transition relation method. This information is helpful, but alone does not lead to significant improvement; the inter-subprogram relationships (variable dependencies) is the culprit. Partitioning the subprograms into the equivalence classes, the cyclic variable data dependencies, produces the best result. Reachability analysis is a least fix point computation over the transition system defined by the original program, so it can easily be concluded that dividing and operating on a programs individual parallel fix points would be superior. In addition, not all subprogram SCCs are equal. When a SCC is found to be dependent on the input variable(s), the SCC saturates faster and produces smaller intermediate BDDs. These SCCs are favored whenever they are found during analysis.

An expression of the steps of methods in accordance with this invention may be characterized as:

Parse input source and create CFG;
Perform control and data dependence analysis on CFG;
Generate PDG;
Eliminate infeasible data dependency paths from PDG using abstract interpretation (integer interval abstract domain) if model checking of subprogram reachability property timeouts;
Extract data dependency SCCs from the PDG—if intractable, reduce every instance of a variable to a single instance and repeat once;
If previous step was successful, perform input data analysis on SCCs using abstract interpretation (simple abstract domain) or else quit.
Perform abstract interpretation (integer interval abstract domain) on all subprograms consisting only the variables contained in a SCCs;
Eliminate SCCs whose abstract interpretation results are contained in an input data dependent SCC abstract interpretation result, but add its decision predicates to the input data dependent asbtract interpretation SCC decision set; and
Generate hints from remaining SCCs using the decision sets of each SCC following the partial ordering on the subprogram SCCs.

During the determination of hints, a goal is to retrieve pertinent information (valid paths, over-approximate reachable states, etc.) from the original program text by utilizing the smallest subset of the original program text during the analysis while achieving the same results. Program slicing allows efficient and effective achievement of this goal. Program slicing is a technique used during static program analysis to identify all statements that might affect the value of a given variable occurrence. The statements selected constitute a subprogram with respect to the variable occurrence. For a statement $S_i$ in a PDG, the static program slice with respect to $S_i$ is the set of statements $S_1, S_2, S_3, \ldots$ in the PDG that can reach $S_i$ via a path of flow or control dependence edges. The program slice for a set of statements S is simply the union of each statement $S_i$ program slice. Moreover, a program slice exhibits the same behavior as the original program for the variables of interest for the same input data. Program slicing or parsing is employed during infeasible path analysis and valid computational paths to minimize the size of the original source used to verify these properties; such as, "whether or not there exists a path such that the value assigned to $S_1$ at location x is used by $S_2$ at location y?".

The naive approach to determining the computational paths in a program is to generate all possible paths in the programs CFG. This would result in up to $2^n$ computational paths, where n is the number of directed acyclic paths in the CFG or the number of decisions in the program text. Here, the set of computational paths is limited to the paths that arise from the cyclic dependency relationship between the program variables and the partitioning of the original program over its input space. These paths represent the possible fix point computations that are active during reachability analysis. By determining these paths early the inter-computational interactions that cause the intermediate BDD explosion can be prevented. Conceptually a program may be thought of as a collection of subprograms, each computing values for some or all the program variables. Several subprograms may compute values of the same variable and overlap one another. The more complex the control structure or number of decisions, the more complex the intermingling of the subprograms. Static program slicing isolates all possible subprograms computing a particular variable and its control and data dependencies.

For a program P and its associated CFG, there exists for each path in the computation tree a corresponding path in the CFG. Many paths in the computation tree may map to the same path in the CFG and that there may exist paths in the CFG that do not correspond to computation tree paths. For example, consider a boolean predicate that, because of previous computation, always evaluates to the constant true. The computation tree would have no paths where this predicate evaluates false, but the CFG may represent both possible conditional edges emanating from the node representing the conditional predicate. Thus, the CFG approximates the computation tree by representing additional behaviors, which do not correspond to any program execution. Such spurious executions are called infeasible paths. It can be said that the CFG overestimates program behavior. In previous discussion, the naive approach to defining a program slice would entail finding all nodes whose execution could possible affect the value of a variable at some node. This over approximation introduces infeasible paths in the subprogram produced by the program slice.

Isolating the source of the fix points in a program (subprogram) is key to keeping the intermediate BDDs small. The set of program variables are not all interdependent and an ordering among the equivalence classes of the variables may be obtained by partitioning the variables. Restricting fix point computations (reachability analysis) to each partition and arranging these computations to follow the implied partial ordering will yield greater efficiency than the naive approach. More specifically, for any PDG and its associated data dependency graph, it is possible to easily extract the strongly connected components (SCCs) graph [elementary-Circuits]. The SCC graphs can be collapsed into a single node resulting in a topological sort of the partial ordering formed by these nodes. This order is used to determine the order of the final hints produced.

The input data dependency analysis performed on the final set of computational paths with cyclic dependencies is to determine whether the variables included in a SCC are input dependent. A input dependent SCC will saturate faster and produce smaller BDDs. This method favors input dependent SCCs over non-input dependent SCCs for the same variable IDs.

The technique here described has been implemented on a 400 MHz Pentium IV machine with 500 MB of RAM running Linux. The results are reported in the Table below.

| Circuit | Ffs | Reachable states | Times | | |
|---|---|---|---|---|---|
| | | | BFS | Manual Hints | Invention technique |
| CRC | 32 | 4.295e+09 | Memory out | 0.17 | 0.17 |
| BPB | 36 | 6.872e+10 | 193.79 | 1.04 | 52.77 |
| Rotator | 64 | 1.845e+19 | Memory out | 0.17 | 0.17 |
| Vsa | 66 | 1.625e+14 | 6974.7 | 111.8 | 175.34 |

Four circuits having Verilog source files and which did not require intertask support were used in the implementations. CRC computes a 32-bit cyclic redundancy code of a stream of bytes. BPB is a branch prediction buffer that predicts whether a branch should be taken depending on the correctness of the previous predictions. Rotator is a barrel shifter sandwiched between registers. Vsa is a very simple non-pipelined microprocessor that executes 12-bit instructions—ALU operations, loads, stores, conditional branch—in five stages: fetch, decode, execute, memory access, and writeback. It has four registers, with one always set to zero.

The table shows the comparison of reachability analysis with hints generated by the inventive technique against BFS runs and manual hints. Columns 1, 2, and 3 give the name of the circuit, number of flip-flops (state variables) and number of reachable states of the circuit. Columns 4, 5 and 6 compare run times for reachability analysis for BFS, manual hints, and hints obtained using the technique of this invention, respectively. The circuits in this table are mid-sized, but two of these circuits—CRC and Rotator—run out of memory for BFS. The inventive and manual hints were able to provide dramatic improvements to the traversal of these circuits, enabling completion times of a few seconds. With the remaining circuits in BPB and Vsa demonstrate 1–2 orders of magnitude improvement.

In this disclosure it has been shown that state traversal guided by algorithm generated hints can substantially speed up reachability analysis. Orders-of-magnitude improvement have been obtained is several cases, and visible gains have been achieved in most experiments that have been run. The hints prescribe constraints for the input and state variables of the system. Deriving the hints requires some knowledge of the circuit organization and behavior, at the level a verification engineer needs to devise simulation stimuli or properties to be checked. Simple heuristics often allow one to find hints that are effective for both properties that fail and properties that pass.

In the drawings and specifications there has been set forth a preferred embodiment of the invention and, although specific terms are used, the description thus given uses terminology in a generic and descriptive sense only and not for purposes of limitation.

What is claimed is:

1. A method for generating hints for use in analyzing an original program, the method comprising:
    partitioning the original program into subprograms each defining a valid computational path;
    determining whether cyclic dependencies exist between variables of the subprograms;
    refining an order of the subprograms if cyclic dependencies are found to exist;
    determining reachable states for each subprogram;
    merging subprograms whose computational paths have reachable states found to be contained in another computational path;
    determining conjoined decision conditions among the merged subprograms; and
    generating hints for analyzing the original program using the conjoined decision conditions.

2. The method of claim 1 further comprising:
    performing a breadth first search using the hints as constraints to verify operation of the original program.

3. The method of claim 1 wherein partitioning the original program further comprises:
    determining a control flow graph of the original program.

4. The method of claim 3 further comprising:
    determining from the control flow graph a program dependence graph.

5. The method of claim 4 further comprising:
    compiling a list of subprograms contained within the original program which are candidates for hints for analysis of the original program; and
    sorting the list of subprograms using the program dependence graph.

6. The method of claim 1 wherein the original program is an integrated circuit device design program.

7. The method of claim 1 wherein the original program is a hardware design language (HDL) program.

8. A method for generating hints for use in analyzing an original program, the method comprising:
    extracting a control flow graph from the original program;
    extracting a program dependence graph from the control flow graph;
    compiling a list of subprograms contained within the original program which are candidates for hints for analysis of the original program;
    determining whether cyclic dependencies exist between variables of the subprograms;
    sorting the compiled list using the program dependence graph according to the cyclic dependencies of the original program; and
    generating hints using the sorted compiled list, wherein the hints are used for analyzing the original program.

9. The method of claim 8 further comprising performing a breadth first search using the hints as constraints to verify operation of the original program.

10. The method of claim 8 further comprising:
    removing false data dependency arcs from the program dependence graph, wherein the false data dependency arcs do not correspond to real data dependencies of the original program.

11. The method of claim 10 wherein removing false data dependency arcs further comprises:
    testing each data dependency arc of the program dependence graph to determine whether a definition at a tail of the data dependency arc can reach a usage at a head of each data dependency arc.

12. The method of claim 11 wherein testing each data dependency arc further comprises:
    running model checking of each data dependency arc for an allotted time to determine reachability of each data dependency arc;
    performing abstract interpretation of a data dependency arc for the allotted time in the event that the model checking of the data dependency arc is not completed within the allotted time;

removing the data dependency arc from the program dependence graph if the abstract interpretation determines that the data dependency arc is infeasible; and retaining the data dependency arc if the abstract interpretation is not completed within the allotted time.

13. The method of claim 12 wherein compiling a list of subprograms further comprises:

generating a polar spanning tree of the original program using the control flow graph;

augmenting the polar spanning tree with back arcs of the original program;

producing candidate subgraphs of the original program;

enumerating the spanning tree by taking into account input data dependencies and feasibility of computational paths of the original program; and paring down the candidates for hints by selecting the best hints from the candidate subgraphs, wherein the best hints are selected using a heuristic rule.

14. The method of claim 13 wherein the heuristic rule selects candidate subgraphs reaching the most reachable states during the abstract interpretation.

15. The method of claim 13 wherein the heuristic rule selects candidate subgraphs that result in the smallest binary decision diagrams for transition relations during the model checking of the original program.

16. A method for generating hints for use in analyzing an original program, the method comprising:

parsing the original program into subprograms;

creating a control flow graph of the original program;

performing control and data dependency analysis on the control flow graph;

generating a program dependence graph of the original program from the control flow graph;

determining reachability of each of the subprograms;

compiling a list of subprograms contained in the original program which are candidates for hints for analysis of the original program;

determining whether cyclic dependencies exist between variables of the subprograms;

sorting the compiled list using the program dependence graph according to the cyclic dependencies of the original program; and generating hints using the sorted compiled list, wherein the hints are used for analyzing the original program.

17. The method of claim 16 further comprising performing a breadth first search using the hints as constraints to verify operation of the original program.

18. The method of claim 16 wherein determining reachability of each subprogram further comprises:

running model checking of each data dependency arc of the program dependence graph for an allotted time to determine reachability of each data dependency arc;

performing abstract interpretation of a data dependency arc for the allotted time in the event that the model checking of the data dependency arc is not completed within the allotted time;

removing the data dependency arc from the program dependence graph if the abstract interpretation determines that the data dependency arc is infeasible; and retaining the data dependency arc if the abstract interpretation is not completed within the allotted time.

19. The method of claim 16 further comprising:

determining an initial order of the candidate subprograms from data dependency strongly connected components of each subprogram.

20. The method of claim 16 further comprising:

extracting data dependency strongly connected components from the program dependence graph:

performing abstract interpretation on the strongly connected components to determine whether the strongly connected components are dependent on input data;

performing abstract interpretation on subprograms consisting of only variables contained in a strongly connected component;

eliminating strongly connected components whose abstract interpretation results are contained in an input data dependent abstract interpretation strongly connected component decision set; and generating hints from remaining strongly connected components using the decision sets of each strongly connected component following a partial ordering of the subprogram strongly connected components.

21. A method for generating hints for use in analyzing an original program, the method comprising:

parsing the original program into subprograms;

creating a control flow graph of the original program;

performing control and data dependency analysis on the control flow graph;

generating a program dependence graph of the original program from the control flow graph;

running model checking of each data dependency arc of the program dependence graph for an allotted time to determine reachability of each data dependency arc;

performing abstract interpretation of a data dependency arc for the allotted time in the event that the model checking of the data dependency arc is not completed within the allotted time;

removing the data dependency arc from the program dependence graph if the abstract interpretation determines that the data dependency arc is infeasible;

retaining the data dependency arc if the abstract interpretation is not completed within the allotted time;

compiling a list of subprograms contained in the original program which are candidates for hints for analysis of the original program;

extracting data dependency strongly connected components from the program dependence graph;

determining an initial order of the candidate subprograms from strongly connected components of each subprogram;

determining whether cyclic dependencies exist between variables of the subprograms;

sorting the compiled list using the program dependence graph according to the cyclic dependencies of the original program;

performing abstract interpretation on the strongly connected components to determine whether the strongly connected components are dependent on input data;

performing abstract interpretation on subprograms consisting of only variables contained in a strongly connected component;

eliminating strongly connected components whose abstract interpretation results are contained in an input data dependent abstract interpretation strongly connected component decision set;

performing a partial ordering of remaining subprogram strongly connected components; and generating hints from the remaining strongly connected components using the decision set of each strongly connected component.

* * * * *